(12) United States Patent
Yamamoto et al.

(10) Patent No.: US 10,117,345 B2
(45) Date of Patent: Oct. 30, 2018

(54) TERMINAL DEVICE

(71) Applicant: FUJITSU LIMITED, Kawasaki-shi, Kanagawa (JP)

(72) Inventors: Yasufumi Yamamoto, Kawasaki (JP); Kenji Suzuki, Kawasaki (JP); Yoshiyuki Sando, Kawasaki (JP)

(*) Notice: Subject to any disclaimer, the term of this patent is extended or adjusted under 35 U.S.C. 154(b) by 0 days.

(21) Appl. No.: 15/611,099

(22) Filed: Jun. 1, 2017

(65) Prior Publication Data
US 2018/0054903 A1 Feb. 22, 2018

(30) Foreign Application Priority Data

Aug. 18, 2016 (JP) .................. 2016-160500

(51) Int. Cl.
| | |
|---|---|
| H05K 5/02 | (2006.01) |
| H05K 5/03 | (2006.01) |
| H05K 5/00 | (2006.01) |
| G06F 3/044 | (2006.01) |
| G06F 3/045 | (2006.01) |
| H04N 5/225 | (2006.01) |

(52) U.S. Cl.
CPC ......... *H05K 5/0217* (2013.01); *H05K 5/0008* (2013.01); *H05K 5/0017* (2013.01); *H05K 5/0086* (2013.01); *H05K 5/03* (2013.01); *G06F 3/044* (2013.01); *G06F 3/045* (2013.01); *G06F 2203/04107* (2013.01); *H04N 5/2257* (2013.01)

(58) Field of Classification Search
CPC .. H05K 5/0217; H05K 5/0017; H05K 5/0008; H05K 5/03; H05K 5/0086; H04N 5/2257; G06F 3/045; G06F 3/044; G06F 2203/04107; G02F 1/133308
USPC ...................................... 349/58–60
See application file for complete search history.

(56) References Cited

U.S. PATENT DOCUMENTS

| | | | | |
|---|---|---|---|---|
| 7,059,182 | B1 * | 6/2006 | Ragner ................ | H05K 5/0086 73/200 |
| 9,612,622 | B2 * | 4/2017 | Moon .................. | G06F 1/1656 |
| 2007/0019275 | A1 * | 1/2007 | Okuda .............. | G02F 1/133615 359/265 |
| 2011/0116220 | A1 * | 5/2011 | Lee ................... | G02F 1/133308 361/679.02 |
| 2012/0154997 | A1 * | 6/2012 | Shi ........................ | G06F 1/1656 361/679.01 |

(Continued)

FOREIGN PATENT DOCUMENTS

| | | |
|---|---|---|
| JP | 2003-316275 | 11/2003 |
| JP | 2008-233336 | 10/2008 |
| JP | 2010-067730 | 3/2010 |

*Primary Examiner* — Steven T Sawyer
*Assistant Examiner* — Sagar Shrestha
(74) *Attorney, Agent, or Firm* — Harness, Dickey & Pierce, P.L.C.

(57) ABSTRACT

A terminal device includes: a first support member that supports a first component; a second support member that is separately provided from the first support member and that holds a second component having shock resistance lower than shock resistance of the first component; and a protection portion that is provided on the first support member and that extends more outward in a first direction than the second support member, wherein a part of the protection portion, which extends more outward than the second support member, extends in a region that does not overlap the second support member when viewed from the first direction.

12 Claims, 20 Drawing Sheets

(56) References Cited

U.S. PATENT DOCUMENTS

| | | | |
|---|---|---|---|
| 2014/0239781 A1* | 8/2014 | Allore | B29C 45/14311 312/223.1 |
| 2015/0331456 A1* | 11/2015 | Moon | G06F 1/1656 361/51 |
| 2016/0044802 A1* | 2/2016 | Kim | G02F 1/133308 361/679.01 |
| 2017/0355507 A1* | 12/2017 | Rivellini | B65D 81/054 |

* cited by examiner

TERMINAL DEVICE

CROSS-REFERENCE TO RELATED APPLICATION

This application is based upon and claims the benefit of priority of the prior Japanese Patent Application No. 2016-160500, filed on Aug. 18, 2016, the entire contents of which are incorporated herein by reference.

FIELD

The embodiment discussed herein is related to a terminal device.

BACKGROUND

In order to protect a casing of an electronic device from a shock due to dropping of the electronic device, a cushioning structure of the casing of the electronic device is provided.

A related technology is disclosed in Japanese Laid-open Patent Publication No. 2010-067730.

SUMMARY

According to an aspect of the embodiments, a terminal device includes: a first support member that supports a first component; a second support member that is separately provided from the first support member and that holds a second component having shock resistance lower than shock resistance of the first component; and a protection portion that is provided on the first support member and that extends more outward in a first direction than the second support member, wherein a part of the protection portion, which extends more outward than the second support member, extends in a region that does not overlap the second support member when viewed from the first direction.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

For example, in a cushioning structure of an electronic device casing, removable cushioning members are engaged with bosses, respectively, that are provided on four corners of an electronic device, and thus a shock that can be applied to the four corners of the electronic device is absorbed by the cushioning member.

For example, it may be difficult to protect a liquid crystal display device or the like that is a component that has comparatively low shock resistance, for example, a component that includes glass, from a shock due to a fall. For example, this is because the cushioning member described above when viewed from a direction in which a shock is applied is positioned in a region that overlaps an upper casing, and thus the cushioning structure described above is a structure in which the cushioning member is brought into contact with the upper casing and the shock propagate easily to the upper casing.

Figure 1:
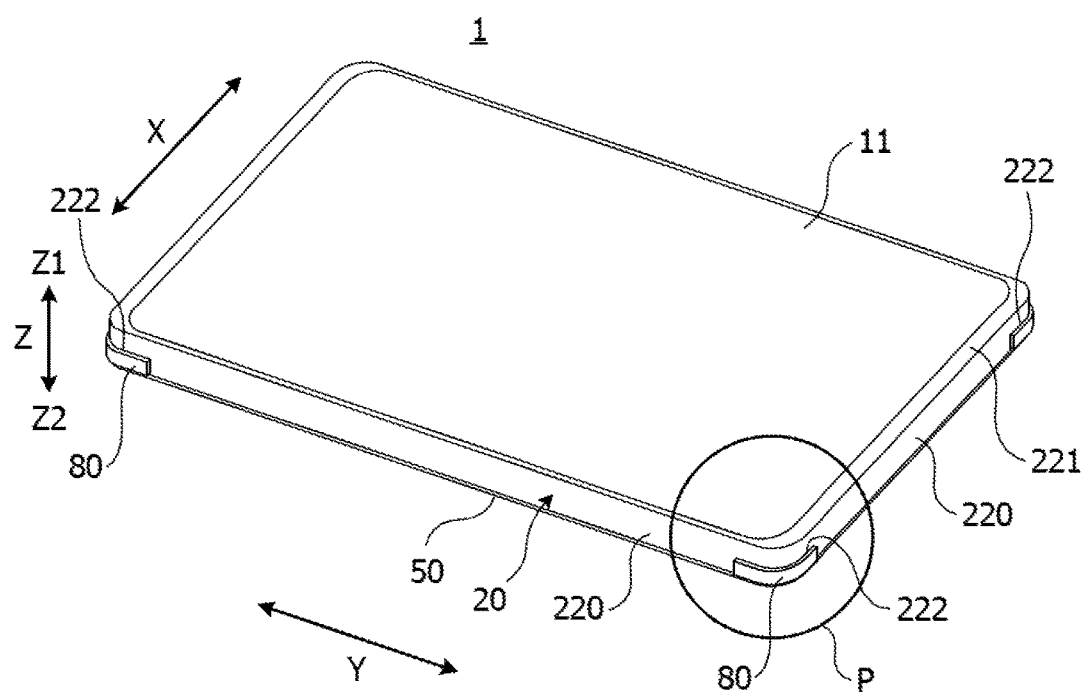
FIG. 1 is an exemplary perspective view of an external appearance of a terminal device.
Figure 2:
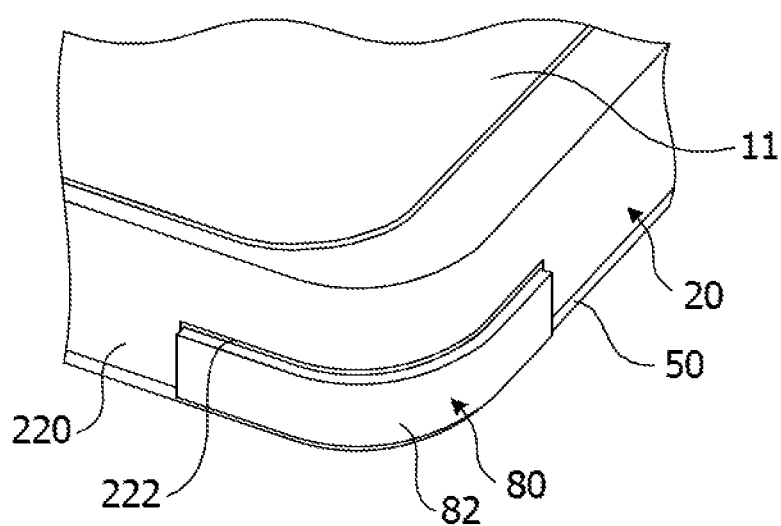
FIG. 2 is an exemplary view of an enlarged portion P of FIG. 1.
Figure 3:
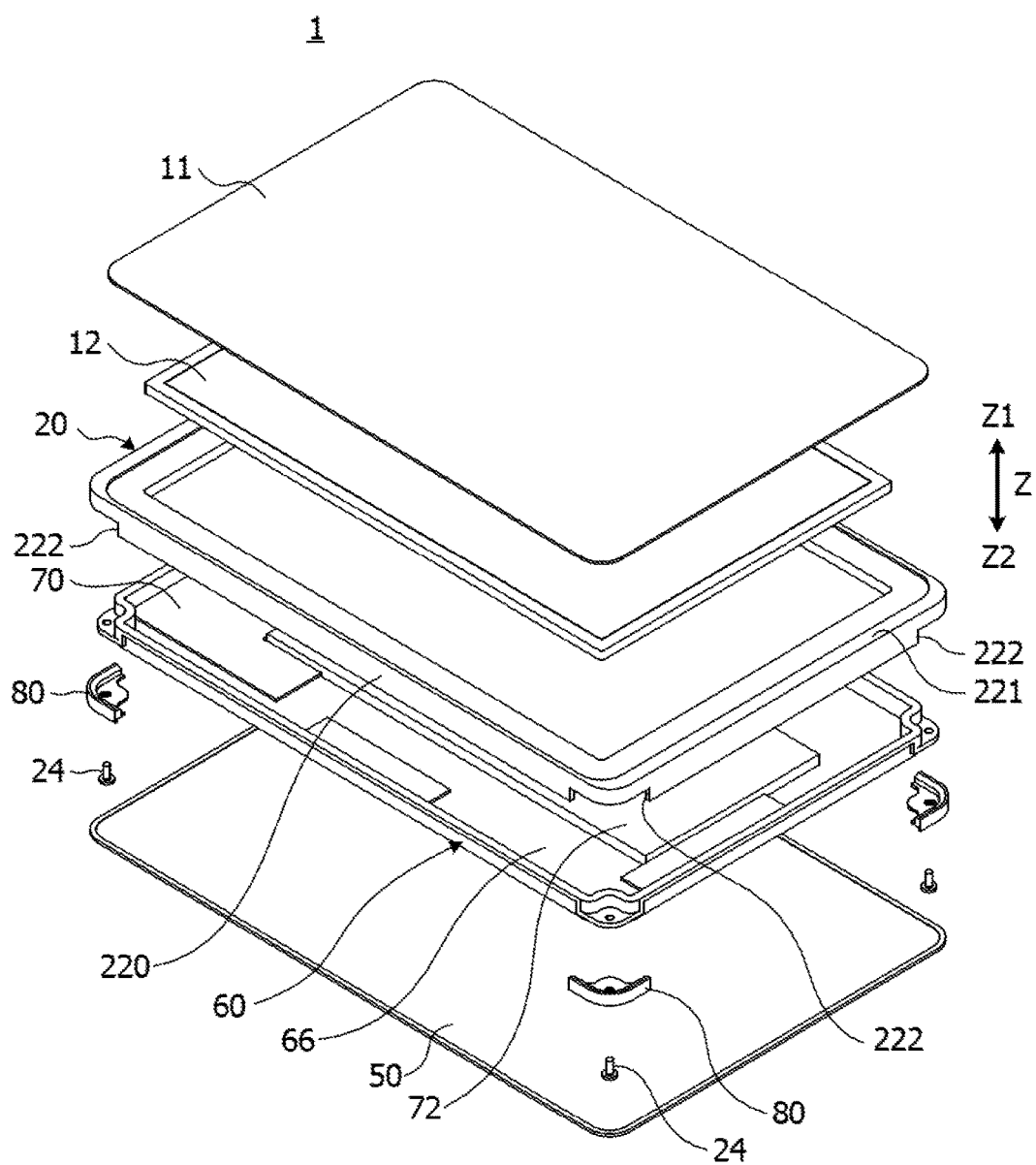
FIG. 3 is an exemplary exploded perspective view of the terminal device.
Figure 4:
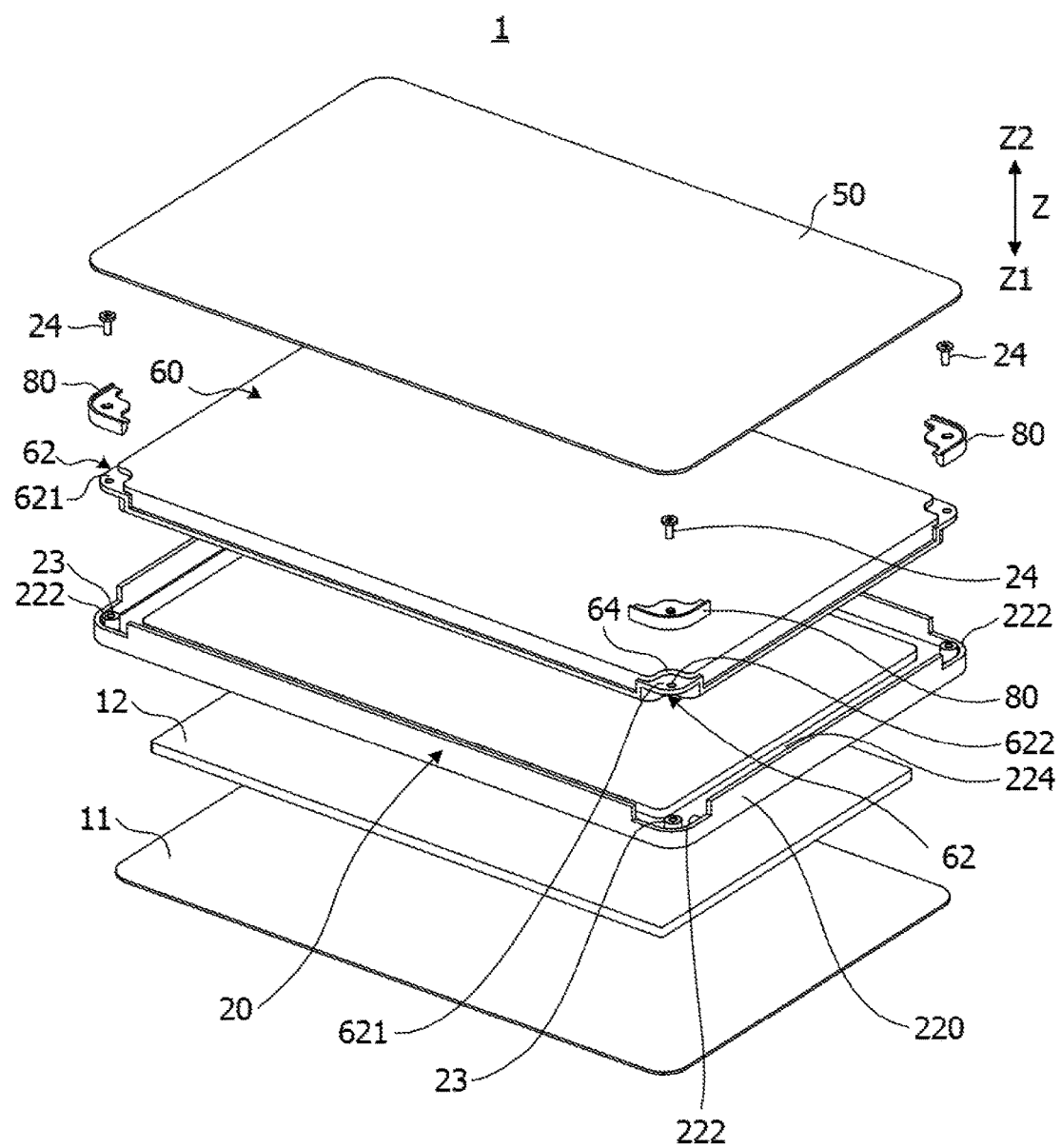
FIG. 4 is an exemplary exploded perspective view of the terminal device.
Figure 5:
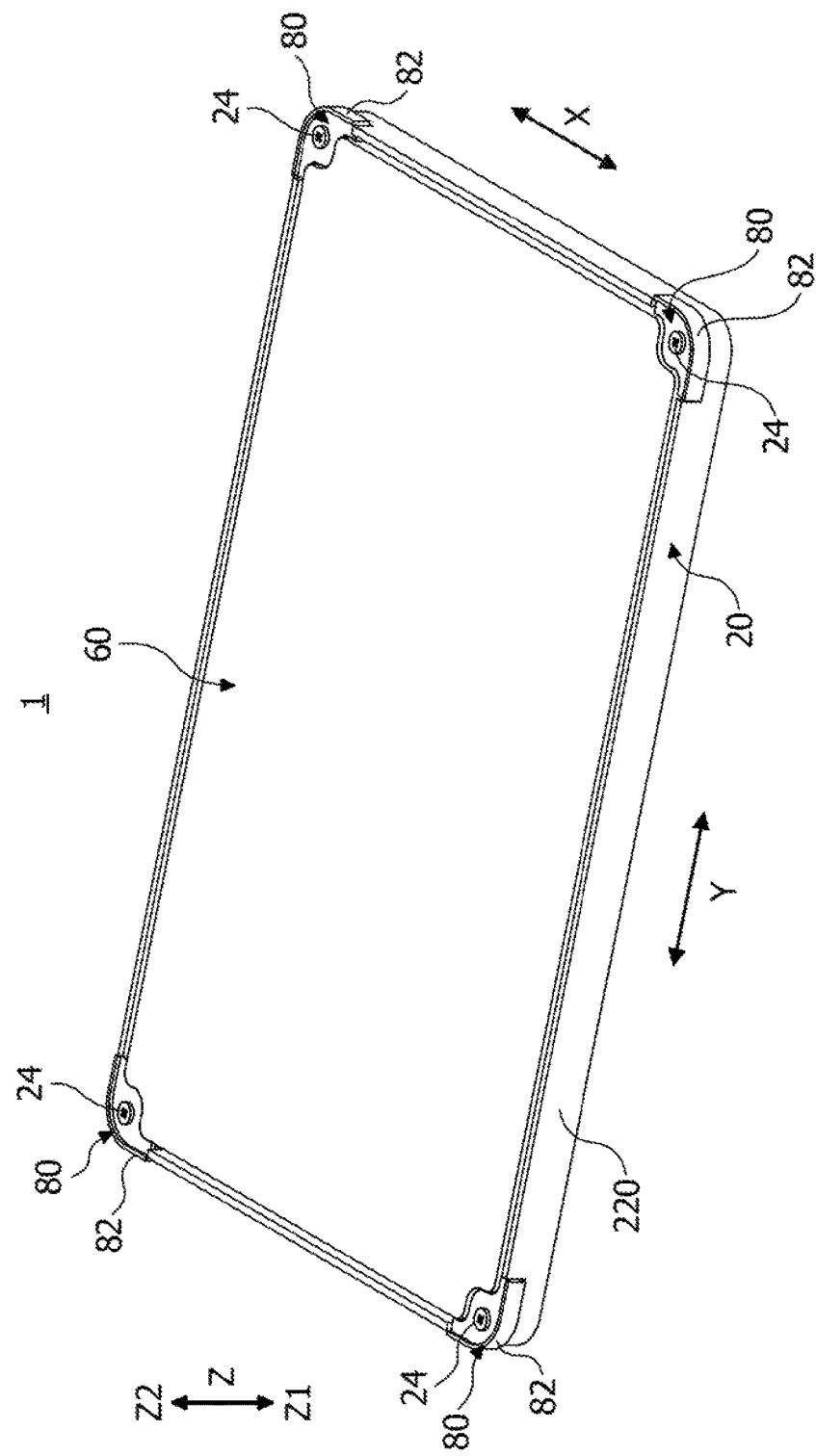
FIG. 5 is an exemplary perspective view of a portion of the terminal device.
Figure 6:
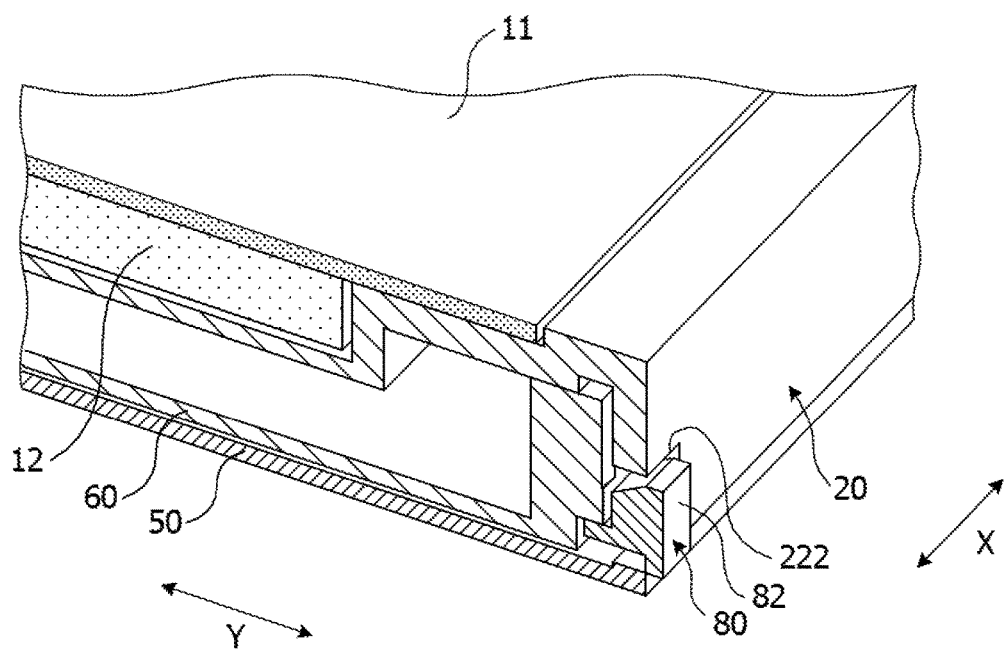
FIG. 6 is an exemplary perspective cross-sectional view of a portion that is cut out of the terminal device.

FIG. 1 illustrates an exemplary perspective view of an external appearance of a terminal device. FIG. 2 illustrates an exemplary view of an enlarged portion P of FIG. 1. FIGS. 3 and 4 illustrate exemplary exploded perspective views of the terminal device. FIG. 3 illustrates a perspective view of the front side, and FIG. 4 illustrates a perspective view of the rear side. FIG. 5 illustrates an exemplary exploded perspective view of one portion of the terminal device. FIG. 5 illustrates a perspective view from the rear side in a state where a back cover 50 is removed. FIG. 6 illustrates an exemplary perspective cross-sectional view of a portion that is cut out of the terminal device. In FIG. 6, an internal structure of a corner portion of a terminal device 1 is illustrated. In FIGS. 3 and 4, illustrations of one or several small members (a screw, a cap, and the like) or the like are omitted.

In the following, for description, a longitudinal direction of the terminal device 1 is defined as a Y direction, and three axes that intersect each other, that is, an X axis, a Y axis, and a Z axis are defined. For example, a display surface of a liquid crystal display (LCD) glass 12 of the terminal device 1 corresponds to a XY plane, a Z1 side of the Z axis corresponds to a front side of the terminal device 1, and a Z2 side corresponds to a rear side (rear surface). A side surface points to a surface that extends in a Z direction, and a side direction points to a direction that extends within the XY plane.

The terminal device 1 is a portable-type electronic device, but may be a fixed-type electronic device such as a laptop computer. The terminal device 1 may be a portable telephone (including a smartphone), a portable information terminal, such as a personal digital assistant (PDA) and a tablet PC, a portable game machine, a portable music player, or the like.

The terminal device 1 includes a touch panel 11, an LCD camera 12, a front cover 20, a back cover 50, an inner cover 60, and a protection portion 80. The front cover 20 and the back cover 50 forms a casing of the terminal device 1, and forms an inner space. In the following, the terms "outside/inside" or "outward/inward" are defined with respect to the inner space within the casing of the terminal device 1. For example, the outside/outward points to a side/direction that gets farther away from the inner space within the casing of the terminal device 1, and the inside/inward points to a side/direction that approaches the inner space with the casing of the terminal device 1.

The touch panel 11 functions as an operation unit of the terminal device 1. The touch panel 11, for example, may be an electrostatic type and may be a resistive touch type. The touch panel 11 extends within the XY plane on the front side of the terminal device 1.

The LCD camera 12, along with the touch panel 11, extends within the XY plane on the front side of the terminal device 1. The LCD camera 12 is provided in a manner that covers a rear surface of the touch panel 11. For example, the LCD camera 12 and the touch panel 11 may be in such a multilayer structure that the touch panel 11 as a layer is included on a front side of the LCD camera 12.

The front cover 20, for example, may be made from a metal plate or resin. The front cover 20 extends within the XY plane, and has an external shape in the form of approximately a rectangle. The front cover 20 is provided on a rear surface of the LCD camera 12, and holds the LCD camera 12 and the touch panel 11. The front cover 20, for example, has a shape that covers a side surface and a rear surface of the LCD camera 12 (refer to FIG. 3).

The front cover 20 includes a boss 22 (one example of a female screw portion), on the inside of which a female screw is tapped, in the rear side surface (a surface that extends within the XY plane). The boss 22 is provided on each of the four corner portions of the front cover 20, corresponding to an attachment position of the protection portion 80. A screw 24 is engaged with the boss 22. The screw 24 and the boss 22 are a fastening portion that connects the front cover 20, the inner cover 60, and the protection portion 80 to each other.

The front cover 20 includes a side surface frame 220 in four directions. The side surface frame 220, as illustrated in FIG. 1, extends from a front surface 221 in the Z2 side of the Z direction. The side surface frame 220 is provided in the upright position to an edge portion along four sides of a rear side surface (a surface that extends within the XY plane) of the front cover 20. An extension width in the Z direction, of the side surface frame 220 is combined with a thickness of the back cover 50, and thus a thickness (a width in the Z direction) of the terminal device 1 is formed. For example, an outer surface of the side surface frame 220 is a design surface (a surface that is exposed as an external appearance) for a side surface of the terminal device 1, and the front surface 221, along with the touch panel 11, is a design surface for a front surface of the terminal device 1. For example, the outer surface of the side surface frame 220 is curved at the four end portions. For example, the four corner portions are chamfered, that is, are rounded (the curvature radius R) in such a manner that the four corner portions are not sharp corners.

The side surface frame 220 surrounds a space (the inner space within the casing) that extends within the XY plane. The inner cover 60 is provided in a space 224.

The side surface frame 220 has a notch 222 in each of the four corner portions. The notch 222, as illustrated in FIG. 1 and FIG. 2, may be formed in one portion in the Z direction, of the side surface frame 220. In FIG. 1 and FIG. 2, the notch 222 is formed at a portion in the Z2 side of the Z direction, of the side surface frame 220, but may be formed only in the center in the Z direction, of the side surface frame 220, or may be formed at a portion in the Z1 side of the Z direction, of the side surface frame 220.

The back cover 50 is a design surface for a rear surface of the terminal device 1. The back cover 50, for example, is made from resin. For example, in order to increase maintainability, the back cover 50 is separately provided from the inner cover 60, but the back cover 50 may be integrally combined with the inner cover 60.

The inner cover 60 may be a member that is separately provided from the front cover 20. The inner cover 60 is provided on the rear side of the front cover 20. The inner cover 60, as described above, is positioned in the inner space of the casing. For example, the entire inner cover 60 is positioned within the inner space within the casing. For example, the inner cover 60 does not have a part that is exposed to the outside at the surface of the terminal device 1. The inner cover 60, for example, is made from a metal plate or resin. The inner cover 60, as illustrated in FIG. 3, has a surface (a surface on which a component is to be mounted) 66 that extends within the XY plane, and has an external shape in the form of approximately a rectangle that is somewhat smaller than the front cover 20.

The inner cover 60 corresponds to the attachment position of the protection portion 80, and, as illustrated in FIG. 4, includes an attachment portion 62 to which the protection portion 80 is attached and an abutting surface 64 (refer to FIG. 9 that is presented later) on each of the four corner portions. The attachment portion 62, as illustrated in FIG. 4 (or FIG. 9), includes a bearing surface 621 and a screw insertion hole 622. The bearing surface 621 is a bearing surface of the protection portion 80, and the screw insertion hole 622 is a hole through which the screw 24 passes. The screw insertion hole 622 has a diameter that is somewhat greater than a diameter of an axis portion of the screw 24. The screw insertion hole 622 is formed at a position of which the central axis (in the Z direction) is the same as that of the boss 22.

The inner cover 60 as illustrated in FIG. 3, holds various inner constituent elements of the terminal device 1. For example, the inner cover 60 holds a substrate 70 (refer to FIG. 3), a battery 72, or the like. For example, various electronic circuits for realizing various functions of the terminal device 1 are provided in the substrate 70. The electronic circuits may include an electronic circuit that is included in an electronic component in the form of a chip, a wiring pattern that is formed on the substrate, and the like.

Each component held in the inner cover 60 has a shock resistance stronger than that of the touch panel 11 or the LCD camera 12 that is a component held by the front cover 20. For example, the touch panel 11 or the LCD camera 12 is likely to be comparatively easily damaged by receiving a shock, but although receiving a shock, the substrate 70 or the battery 72 is difficult to damage and is comparatively strongly resistant.

The protection portion 80, as illustrated in FIG. 4, is provided on the inner cover 60. The protection portion 80 has a function of protecting the terminal device 1 from a shock that can be applied to the terminal device 1 due to dropping of the terminal device 1 or the like. Constituent elements of the terminal device 1 include components that have comparatively low shock resistance, for example, the LCD camera 12, the touch panel 11, and the like. The protection portion 80 has a function of reducing a shock that propagates to the LCD camera 12 or the touch panel 11.

For example, the protection portion 80 is separately provided from the inner cover 60, and is attached to the inner cover 60. For example, as illustrated in FIG. 5, with the screw 24, the protection portion 80 is fastened to the inner cover 60.

The protection portion 80, for example, as illustrated in FIG. 1, is provided on each of the four corner portions of the terminal device 1 in a state of protruding outward from the side surface of the terminal device 1. For example, each of the four protection portions 80 is provided, corresponding to the notch 222 of the side surface frame 220, which is formed on each of the four corner portions of the terminal device 1. As illustrated in FIG. 2 and FIG. 6, the protection portion 80 extends outward (to the outer side of the side direction) pass the side surface frame 220, from behind the side surface frame 220, through the notch 222 of the side surface frame 220 of the front cover 20. Therefore, the protection portion 80, as illustrated in FIG. 2, extends (to the outer side of the side direction) more outward than the front cover 20, on each of the four corner portions of the terminal device 1. In the following, a part that extends more outward than the front cover 20, of the protection portion 80 is referred to as a "protrusion part 82".

The protrusion part 82 of the protection portion 80 extends in a region that does not overlap the front cover 20 when viewed from the side surface. For example, the front cover 20 does not extend (in close proximity) at a portion that is positioned more inside than the protrusion part 82 of the protection portion 80 within the XY plane. For example, when viewed from the side surface, the protrusion part 82 of the protection portion 80 has an external shape that corresponds to the notch 222 of the side surface frame 220, and that is somewhat smaller than the notch 222 (refer to FIG. 2 and FIG. 6). For this reason, when a shock is applied to the protrusion part 82, although the protrusion part 82 is displaced inward, the protrusion part 82 may be brought into contact with the side surface frame 220 of the front cover 20, and the propagation of the shock to the front cover 20 may be reduced.

Figure 7A:
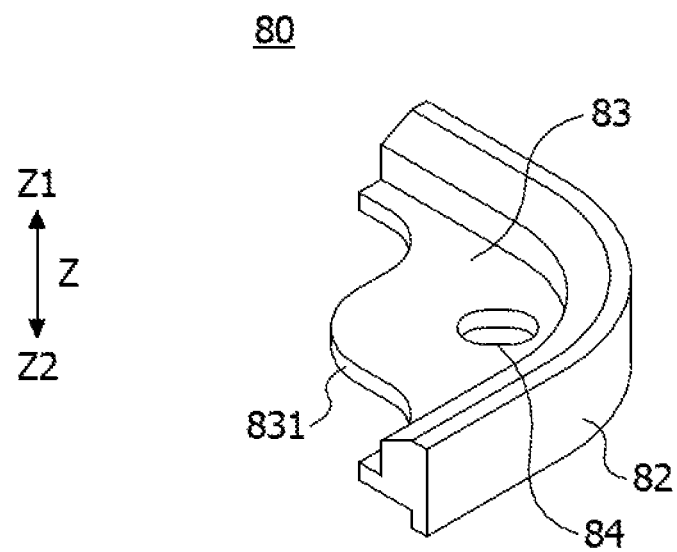
FIG. 7A and FIG. 7B are exemplary perspective views of a protection portion.
Figure 7B:
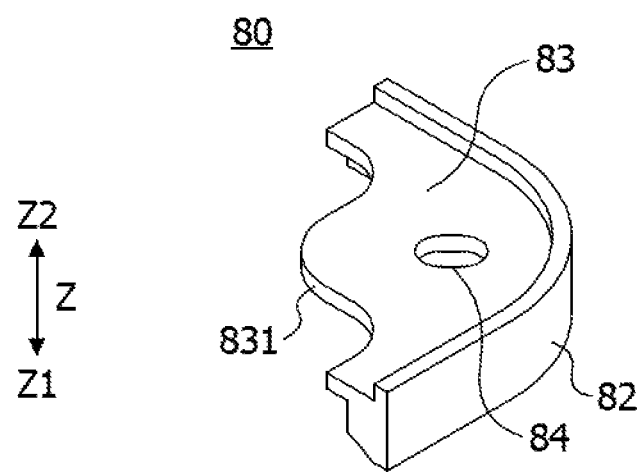
Figure 8:
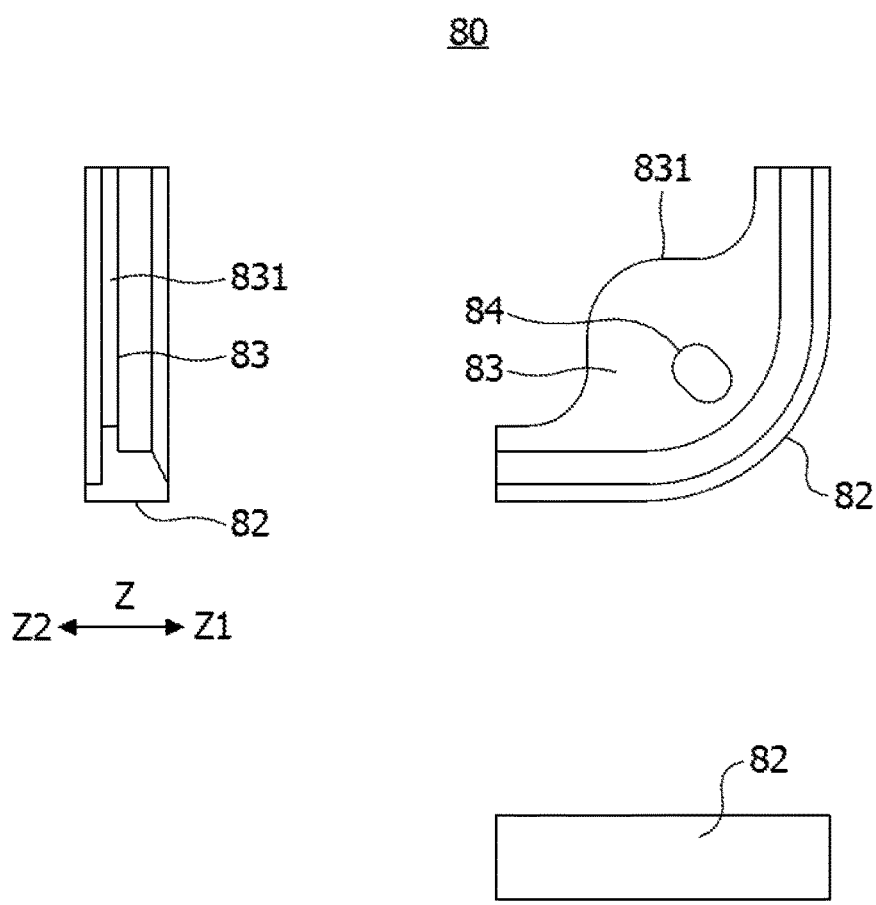
FIG. 8 is an exemplary three-view drawing of the protection portion.
Figure 9:
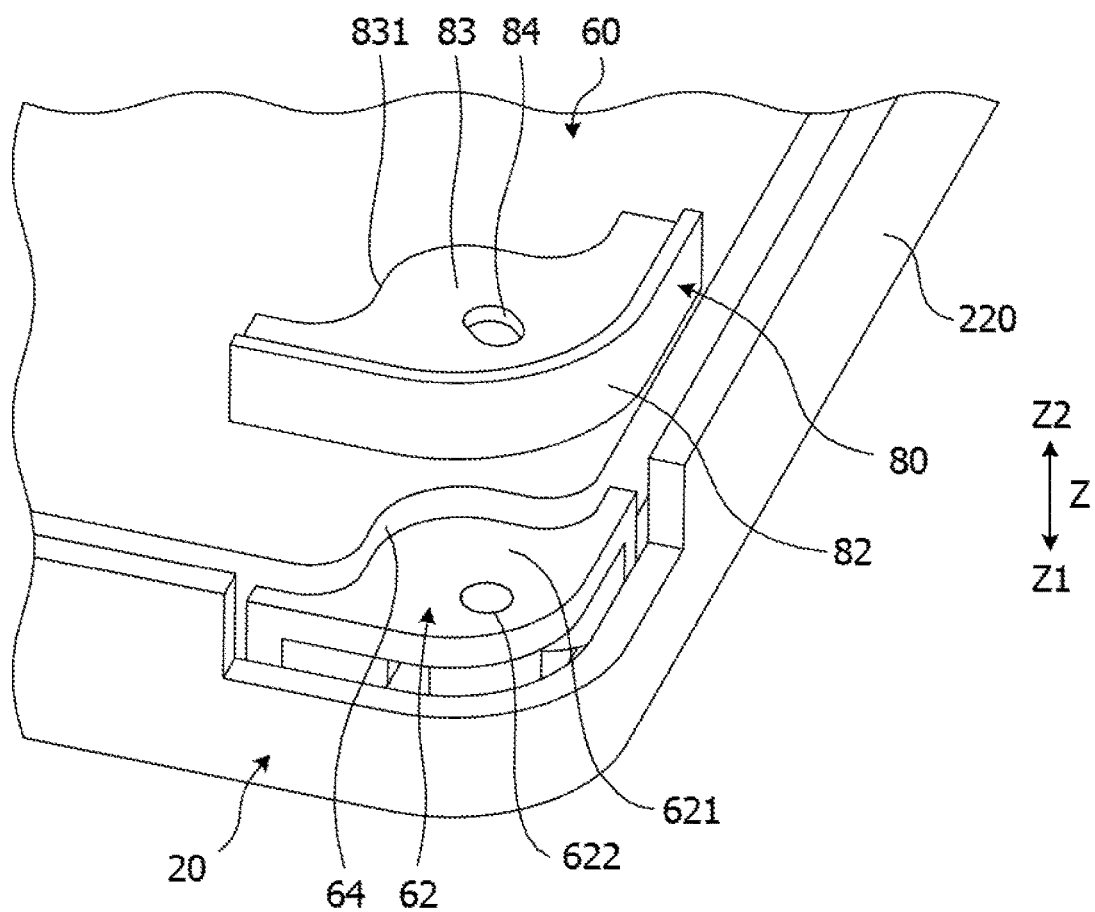
FIG. 9 is an exemplary method of attaching the protection portion.
Figure 10:
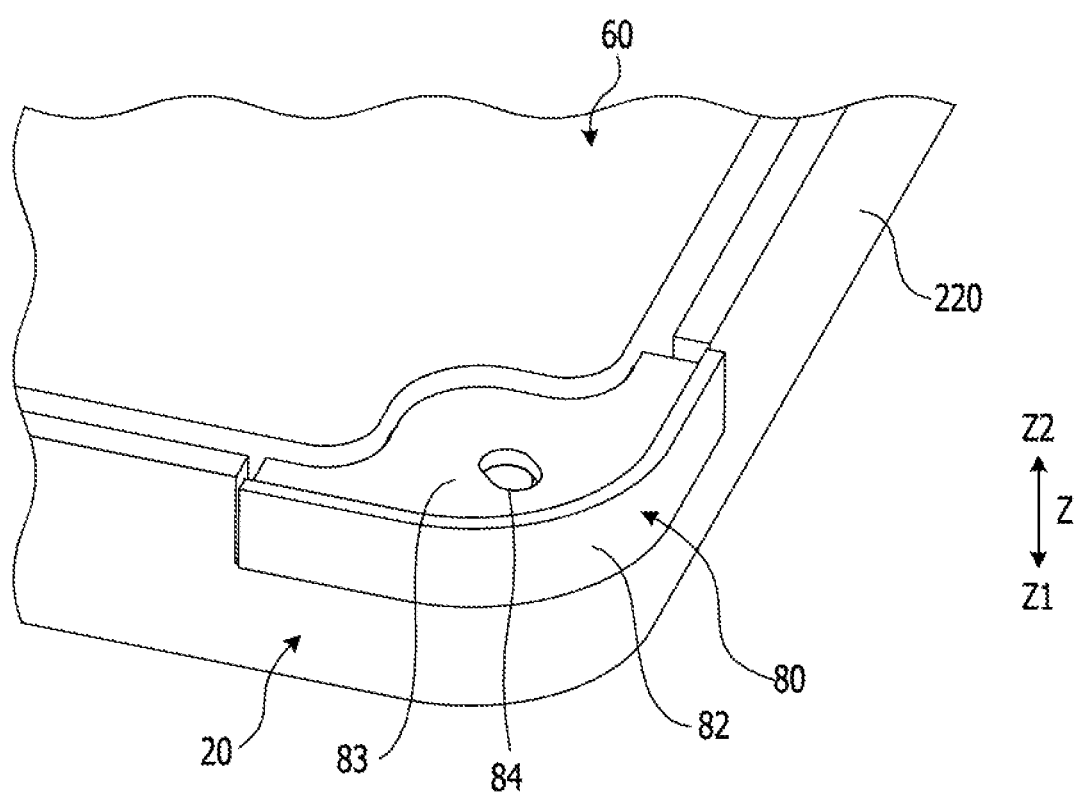
FIG. 10 is an exemplary method of attaching the protection portion.
Figure 11:
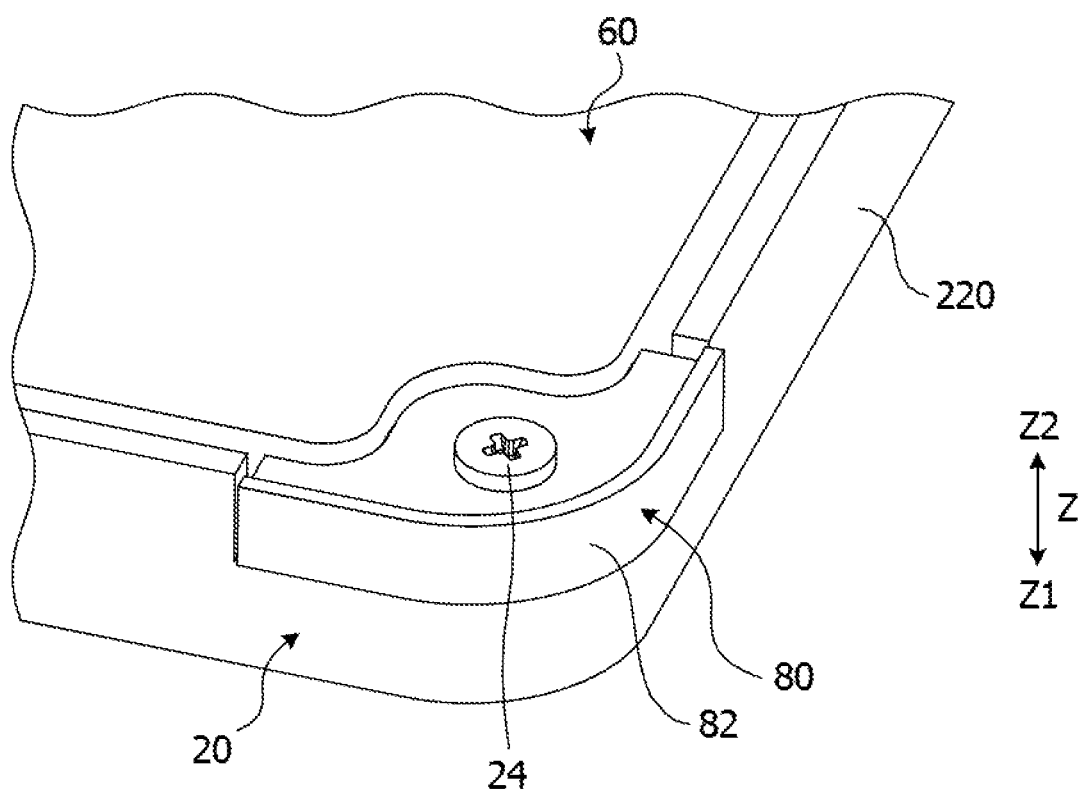
FIG. 11 is an exemplary method of attaching the protection portion.
Figure 12:
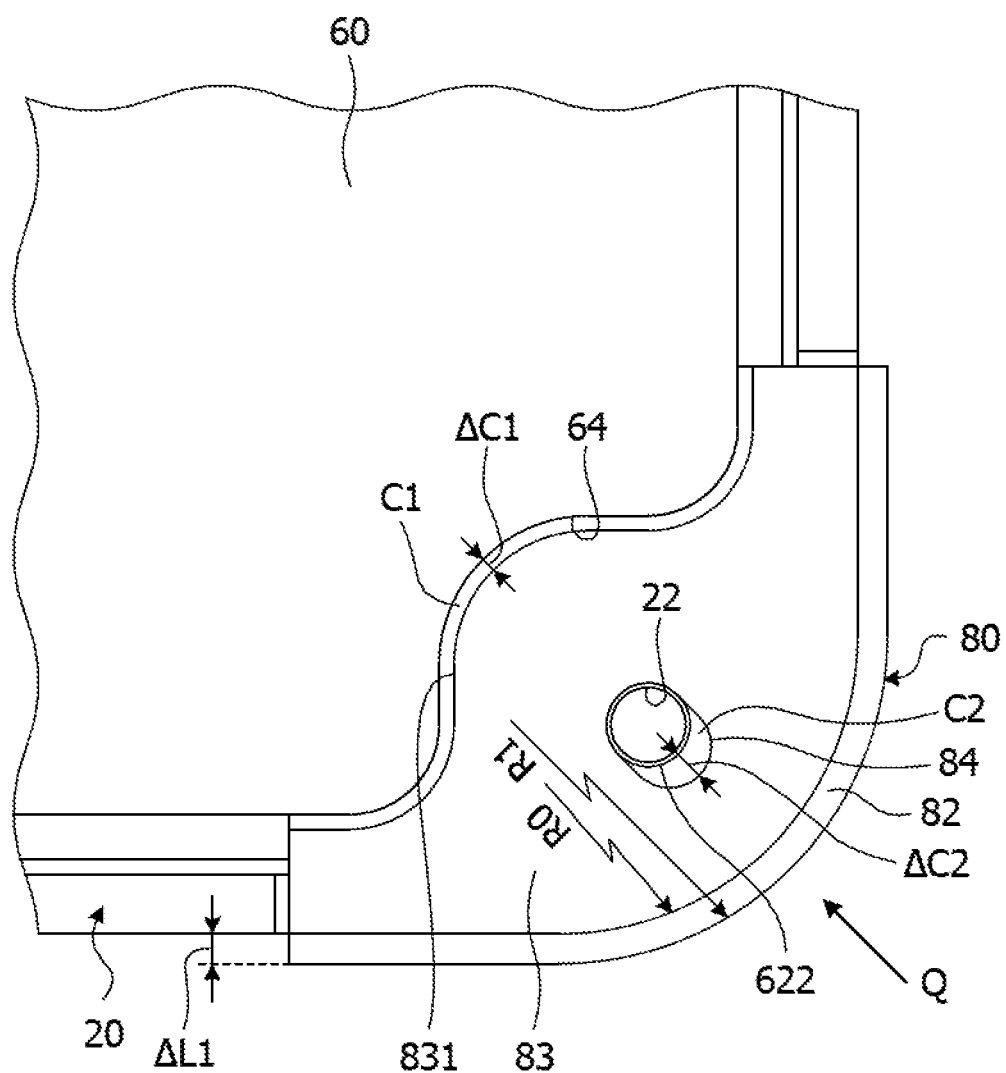
FIG. 12 is an exemplary positional relation between the protection portion and an inner cover and a front cover.

FIG. 7A and FIG. 7B illustrate exemplary perspective views of the protection portion. FIG. 7A illustrates a perspective view of the protection portion 80 when viewed from the front side. FIG. 7B illustrates a perspective view of the protection portion 80 when viewed from the rear side. FIG. 8 illustrates an exemplary three-view drawing of the protection portion. FIG. 9 to FIG. 11 illustrate an exemplary method of attaching the protection portion. FIG. 12 illustrates an exemplary positional relation between the protection portion and the inner cover and the front cover. In FIG. 12, a relation among the protection portion 80, the inner cover 60, and the front cover 20 in a nominal state (a home position on the design) is illustrated. FIG. 12 is an upper surface of a corner portion of the terminal device 1 when viewed from the rear side in a state where the back cover 50 is removed.

The protection portion 80, as illustrated in FIG. 8, includes the protrusion part 82, a base portion 83, and a screw insertion hole 84.

The protrusion part 82, as described above, is a part that extends outward (to the outer side of the side direction) from the front cover 20 in the nominal state. The nominal state refers to a state that results when the attachment is performed according to a design. Because the protrusion part 82 is displaced inward by applying a shock or the like, the term "nominal state" is suitably used for distinction from this post-displacement state.

The protrusion part 82, along with the outer surface of the side surface frame 220, forms a design for the side surface of the terminal device 1. In order to increase design property, the protrusion part 82, for example, has a side surface shape (for example, a side surface shape that connects seamlessly to the outer surface of the neighboring side surface frame 220) that corresponds to the outer surface of the neighboring side surface frame 220. As one example, an outer surface (a side surface) of the protrusion part 82 has such a relation with the outer surface of the side surface frame 220 in the same region that the outer surface of the protrusion part 82 is offset outward by a distance $\Delta L1$ with respect to the outer surface of the side surface frame 220 (refer to FIG. 12). The distance $\Delta L1$ corresponds to the extent to which the protrusion part 82 protrudes in the nominal state. For example, as illustrated in FIG. 12, when a curvature radius of the outer surface of the side surface frame 220 in the corner portion is set to $R0$, a curvature radius $R1$ of the outer surface of the protrusion part 82 has a relationship such that $R1=R0+\Delta L1$. For example, the extent to which the protrusion part 82 protrudes may differ from one place to another (may not be fixed), but the extent of the protrusion along Q (refer to FIG. 12) is set to $\Delta L1$.

The base portion 83 extends within the XY plane. The Z1 side surface of the base portion 83 is planar, and is brought into contact (surface contact) in the Z direction with the attachment portion 62 of the inner cover 60. For example, the base portion 83 sits on the bearing surface 621 of the attachment portion 62 of the inner cover 60 in a state where the base portion 83 is brought into surface contact with the bearing surface 621 of the attachment portion 62 of the inner cover 60. The protrusion part 82 is positioned on an outer edge portion of the base portion 83.

The base portion 83 has an end surface (an inner end surface) 831 that faces the abutting surface 64 of the inner cover 60 in a direction parallel with the XY plane. The abutting surface 64 of the inner cover 60 extends in the Z direction from the attachment portion 62 (refer to FIG. 9), and an end surface 831 of the base portion 83 extends by a thickness of the base portion 83 in the Z direction, and overlap the abutting surface 64 in the Z direction. The end surface 831 of the base portion 83 has a relation with the abutting surface 64 of the inner cover 60 in which the end surface 831 is offset outward by a distance $\Delta C1$ with respect to the abutting surface 64 (refer to FIG. 12). The distance $\Delta C1$ corresponds to a distance that is a gap between the inner cover 60 and the protection portion 80 in the nominal state. For example, the distance that is the gap between the inner cover 60 and the protection portion 80 may differ from one place to another (may not be fixed), but a distance along a direction Q (refer to FIG. 12) is set to $\Delta C1$.

The screw insertion hole 84 is a hole through which the screw 24 passes. The screw insertion hole 84 is a hole that is significantly larger than the axis portion of the screw 24, and is a long hole. For example, as illustrated in FIG. 12, the screw insertion hole 84 is a long hole of which a longitudinal direction is the direction Q that passes through the center of the corner portion. The direction Q that passes through the center of the corner portion is a direction that extends within the XY plane and a direction that passes through the center (line with an angle of 45 degrees) of the corner portion when viewed from above. In FIG. 12, the corner portion has a certain R (the curvature radius R1). The direction Q is a direction that extends within the XY plane and passes through the center of the curvature radius R1.

The direction Q is one of the directions in which the strongest shock is applied to the terminal device 1, among shocks from various directions, which can be applied to the terminal device 1. The direction Q passes through the center of the corner portion, and the corner portion has an angle, but because of this, a shock is easy to receive and as much shock force as is received is easy to concentrate. For this reason, performance indispensable for protection against a shock in the direction Q in the terminal device 1 can be ensured, and performance indispensable for protection against a shock on the corner portion of the terminal device 1 may be substantially ensured. The direction Q may be hereinafter referred to as a "shock direction Q".

In states that are illustrated in FIG. 9 to FIG. 11, the protection portion 80, along with the inner cover 60, is attached (is jointly fastened) to the front cover 20. For example, as illustrated in FIG. 10, the protection portion 80 is mounted on the attachment portion 62 of the inner cover 60, from the state that is illustrated in FIG. 9. The screw 24 is engaged with the boss 22 through the screw insertion hole 84. A fastening torque (a tightening axial force) is arbitrary, but a value may be set in such a manner that, when a shock that is assumed as possible is applied in the shock direction Q, the protection portion 80 can be displaced (slid) inward with respect to the inner cover 60.

In a nominal state where the protection portion 80, along with the inner cover 60, is attached to the front cover 20, as illustrated in FIG. 12, the protection portion 80 faces the abutting surface 64 of the inner cover 60 with a gap C1, the distance ΔC1, in between, when viewed from above. In the nominal state, the protrusion part 82 of the protection portion 80, as illustrated in FIG. 12, protrudes outward, by the extent of the protrusion that is the distance ΔL1, from the front cover 20, when viewed from above. In the nominal state, the protection portion 80, as illustrated in FIG. 12, has a distance ΔC2, a gap C2, in the shock direction Q outside of the axis portion of the screw 24, when viewed from above.

For example, the distance ΔL1, the distance ΔC1, and the distance ΔC2 in the shock direction Q may have the following relationship.

distance ΔC1<distance ΔL1        Relationship 1:

distance ΔC1<distance ΔC2        Relationship 2:

As described above, because the protrusion part 82 of the protection portion 80 extends in the region that does not overlap the front cover 20, by maintaining the relationship 2 described above, the protection portion 80 is displaced by the distance ΔC1 in the shock direction inside of the inner cover 60, when viewed from the side surface. Even in a state where the protection portion 80 is displaced by the distance ΔC1 in the shock direction Q inside of the inner cover 60, by maintaining the relationship 2 described above, a state is obtained where the protection portion 80 is spaced in the shock direction Q away from the axis portion of the screw 24. For example, even in the state where the protection portion 80 is displaced by the distance ΔC1 in the shock direction Q inside of the inner cover 60, by maintaining the relationship 1 described above, a state is obtained where the protrusion part 82 of the protection portion 80 protrudes outward from the front cover 20 (refer to FIG. 13B). For this reason, even in a case where a shock that is so strong that the protection portion 80 is displaced by the distance ΔC1 in the shock direction Q inside of the inner cover 60 is applied, a part that directly receives the shock can be limited only to the protrusion part 82. For example, when the protection portion 80 is displaced by the distance ΔC1 in the shock direction Q inside of the inner cover 60, because the end surface 831 of the protection portion 80 is brought into contact with the abutting surface 64 of the inner cover 60, it may be substantially impossible that the protection portion 80 is further displaced inside.

Figure 13A:
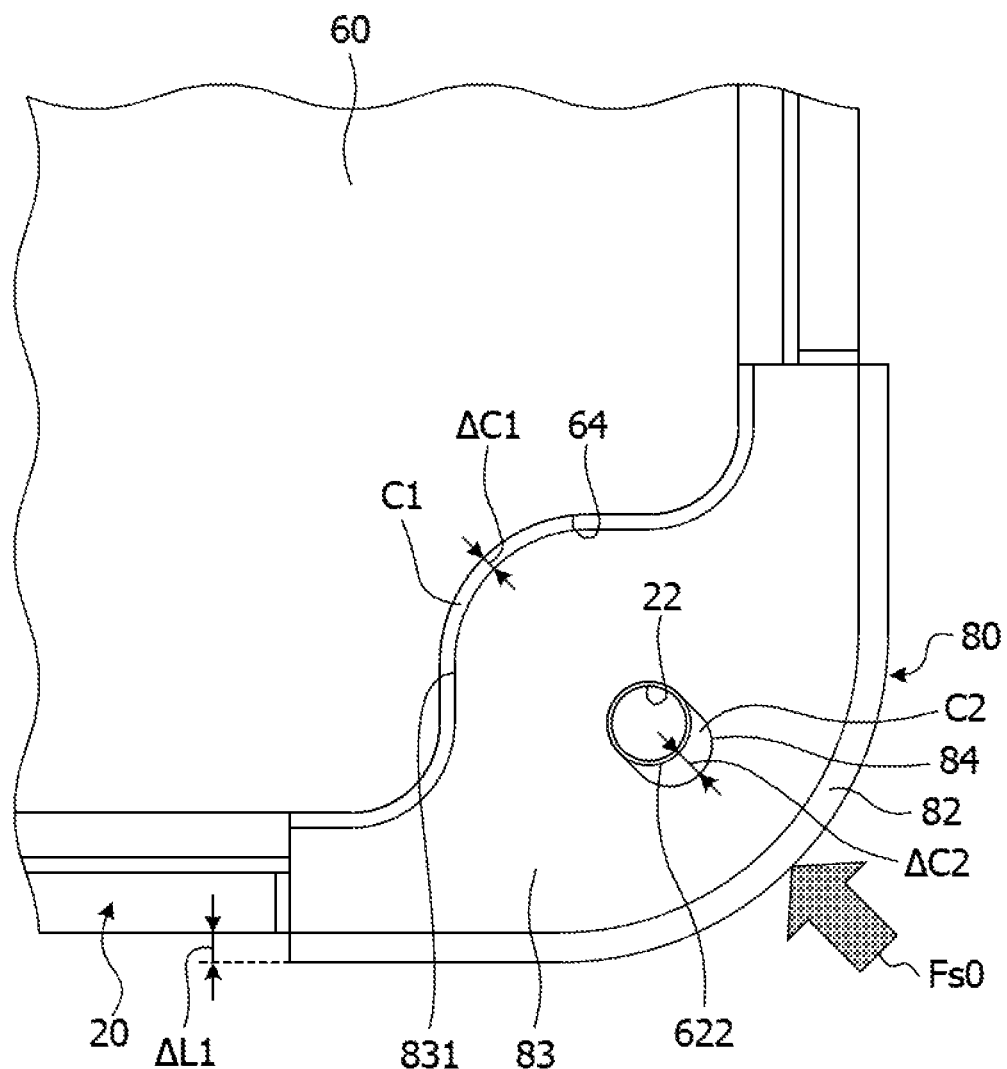
FIG. 13A is an exemplary function of the protection portion.
Figure 13B:
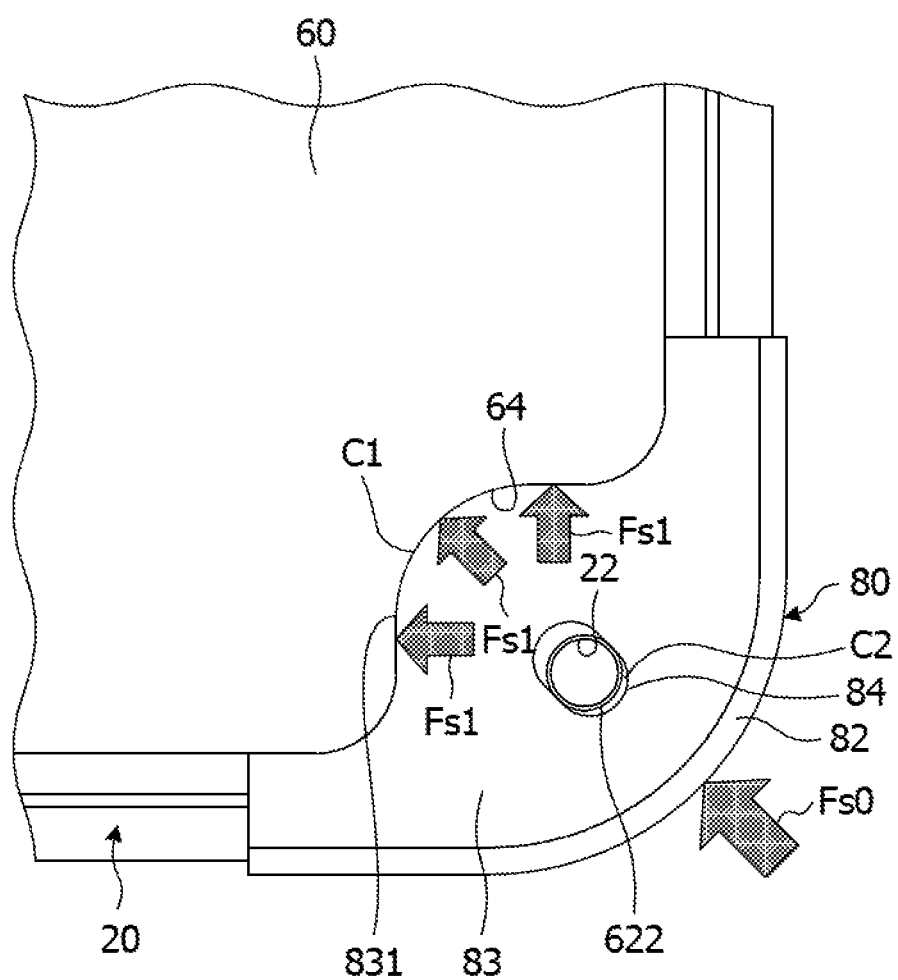
FIG. 13B is an exemplary positional relation between the protection portion and the inner cover and the front cover.
Figure 14A:
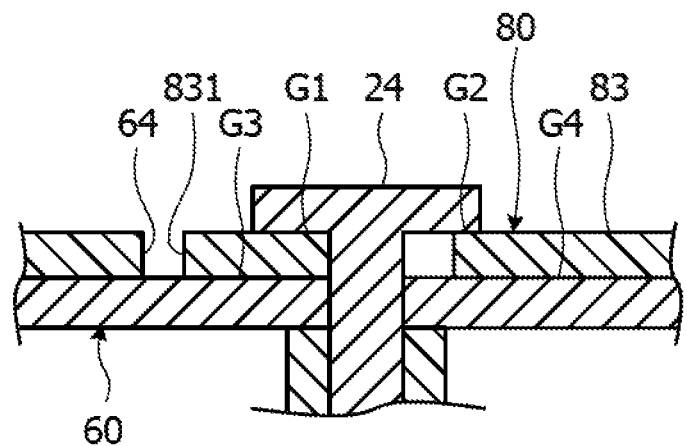
FIG. 14A and FIG. 14B are exemplary cross-sectional views of the protection portion and the inner cover taken along a shock direction.
Figure 14B:
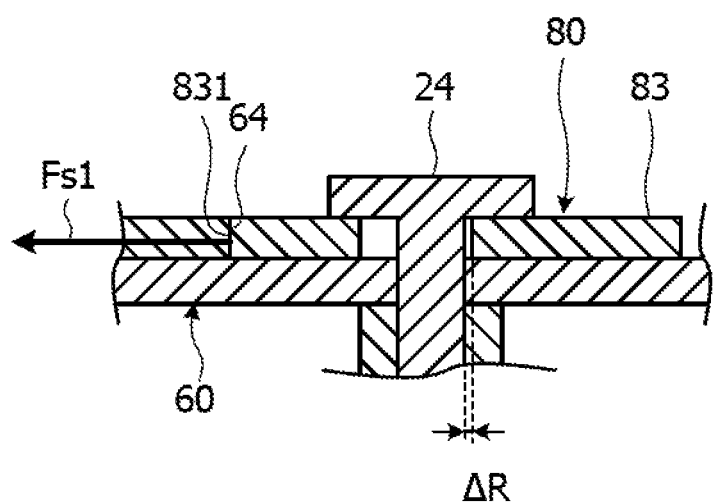

FIG. 13A illustrates an exemplary positional relation between the protection portion, and the inner cover and the front cover. FIG. 13A illustrates an upper surface illustrating a positional relation between the protection portion 80 and the inner cover 60 and the front cover 20 in the nominal state. FIG. 13B illustrates an upper surface illustrating a positional relation between the protection portion 80 and the inner cover 60 and the front cover 20 in a state where a shock is applied to the corner portion of the terminal device 1. FIG. 13A and FIG. 13B illustrate the corner portion of the terminal device 1, when viewed from the rear side in the state where the back cover 50 is removed. FIG. 14A and FIG. 14B illustrate exemplary cross-sectional views of the protection portion and the inner cover taken along the shock direction. FIG. 14A illustrates the nominal state, and the FIG. 14B illustrates the state where the shock is applied to the corner portion of the terminal device 1.

In FIG. 13A, the shock applied in the shock direction Q is indicated by an arrow Fs0. FIG. 13A illustrates a state before the shock is applied. When the corner portion of the terminal device 1 is brought into contact with the ground or the like, a shock is applied to the corner portion of the terminal device 1. In the corner portion of the terminal device 1, as described above, because the protrusion part 82 of the protection portion 80 protrudes outward from the front cover 20, the shock is initially applied to the protrusion part 82 of the protection portion 80, not to the front cover 20. For this reason, when the shock (refer to the arrow Fs0) is applied to the corner portion of the terminal device 1, as illustrated in FIG. 13B, the protection portion 80 is displaced in the shock direction Q inside of the inner cover 60, from the state that is illustrated in FIG. 13A. This displacement from the state that is illustrated in FIG. 13A to the state that is illustrated in FIG. 13B is realized by the protection portion 80 resisting a friction force on a head portion bearing surface (a fastening bearing surface) of the screw 24, a friction on the bearing surface 621 of the inner cover 60, and the like. In FIG. 14A, parts in which friction occurs are indicated by G1 to G4. When the displacement that is resistant to this friction is realized, frictional heat occurs. Therefore, one portion of shock energy as the frictional heat is dissipated. For this reason, a shock component that propagates to the inner cover 60 may be reduced.

In the state that is illustrated in FIG. 13B, the end surface 831 of the protection portion 80 is brought into contact with the abutting surface 64 of the inner cover 60. Therefore, as illustrated in FIG. 13B and FIG. 14B, the shock propagates to the inner cover 60 through a connection portion of the end surface 831 of the protection portion 80 and an abutting portion of the abutting surface 64 of the inner cover 60. For example, as illustrated in FIG. 13B, the end surface 831 of the protection portion 80 and the abutting surface 64 of the inner cover 60 are brought into contact with each other in terms of a surface, not in terms of a point. Therefore, because the surface receives the shock, the inner cover 60 may have the excellent resistance to the shock. Because the end surface 831 of the protection portion 80 and the abutting surface 64 of the inner cover 60 are curved surfaces as illustrated in FIG. 13B, the shock that propagates to the inner cover 60 is distributed in a plurality of directions. For this reason, the resistance of the inner cover 60 to the shock may be further excellent.

When the protection portion 80 is displaced by the distance ΔC1 in the shock direction Q inside of the inner cover 60, because the end surface 831 of the protection portion 80 is brought into contact with the abutting surface 64 of the inner cover 60, it is substantially impossible that the protection portion 80 is further displaced inside. For example, a state where the state that is illustrated in FIG. 13B is substantially displaced to the maximum is obtained. Therefore, although the protection portion 80 is displayed to the maximum in the shock direction Q inside of the inner cover 60, the protrusion part 82 of the protection portion 80 remains in a state of protruding outward from the front cover 20, as illustrated in FIG. 13B and FIG. 14B. For this reason, for example, a disadvantage that, when the protection portion 80 is displaced to the maximum in the shock direction Q inside of the inner cover 60, the protrusion part 82 of the protection portion 80 forms one surface along with the front cover 20, which occurs in a first configuration, may be reduced. For example, in the first configuration, from a point in time when the protrusion part 82 of the protection portion 80 forms one surface along with the front cover 20, the front cover 20 directly receives the shock. The front cover 20 holds the LCD camera 12 or the touch panel 11 that is a component having comparatively low shock resistance. For this reason, the direct receiving of the shock by the front cover 20 easily causes damage to the LCD camera 12 or the touch panel 11. In contrast, as described above, even in a case where a strong shock is applied, the protrusion part 82 of the protection portion 80 remains in a state of protruding outward from the front cover 20. For this reason, the direct receiving of the shock by the front cover 20 may be stopped and the disadvantage that occurs in the first configuration is reduced.

For example, in the state that is illustrated in FIG. 13B, the protection portion 80 is in a state of being spaced in the shock direction Q away from the axis portion of the screw 24, as illustrated as a gap ΔR in FIG. 14B. For this reason, for example, a disadvantage that, when the protection portion 80 is displaced to the maximum in the shock direction Q inside of the inner cover 60, the protection portion 80 is brought into contact with the axis portion of the screw 24, which occurs in a second configuration, may be reduced. For example, in the second configuration, from a point in time when the protection portion 80 is brought into contact with the axis portion of the screw 24, the shock propagates to the front cover 20 through the axis portion of the screw 24. The propagation of the shock to the front cover 20 through the axis portion of the screw 24 easily causes the damage to the LCD camera 12 or the touch panel 11, or the damage to the screw 24. In contrast, as described above, even in the case where a strong shock is applied, the protection portion 80 remains in a state of being spaced in the shock direction Q away from the axis portion of the screw 24. For this reason, the propagation of the shock to the front cover 20 through the axis portion of the screw 24 may be reduced, and the disadvantage that occurs in the second configuration described above may be reduced.

The protection portion 80, as illustrated in FIG. 12, is spaced by the distance ΔC2, the gap C2 in the shock direction Q outside of the axis portion of the screw 24, but may also be spaced outside by the distance ΔC2, the gap C2 in a different direction (for example, the X direction or the Y direction).

A terminal device 1A is different from the terminal device 1 that is illustrated in FIG. 1 in that the inner cover 60 is replaced with an inner cover 60A and the protection portion 80 is replaced with the protection portion 80A. In the following, among constituent elements of the terminal device 1A, a constituent element that may be the same as that of the terminal device 1 that is illustrated in FIG. 1 is the same reference numeral, and a description thereof may be omitted.

Figure 15:
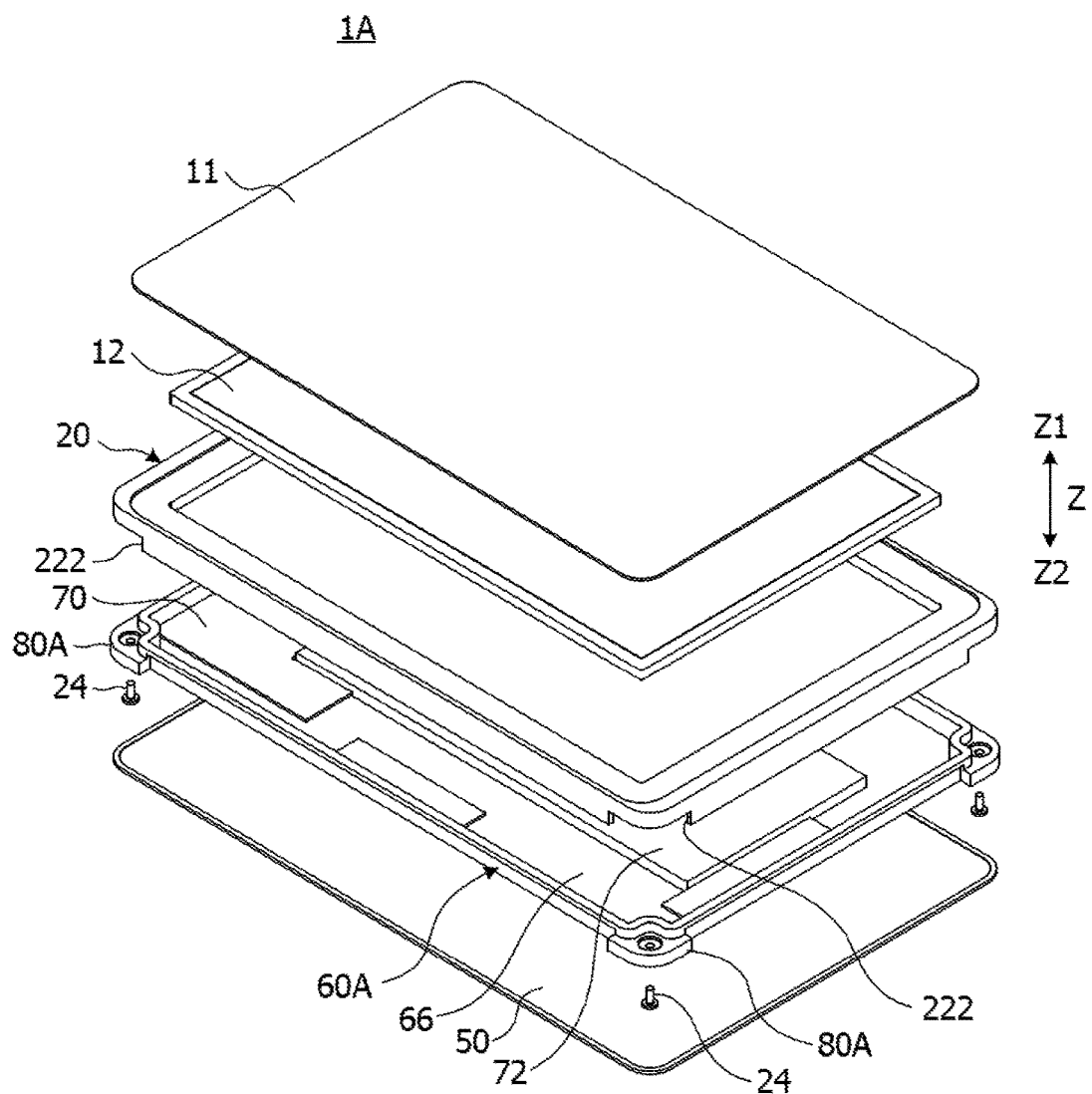
FIG. 15 is an exemplary exploded perspective view of the terminal device.

FIG. 15 illustrates an exemplary exploded perspective view of the terminal device. In FIG. 15, the exploded perspective view of the front side is illustrated.

The inner cover 60A is different from the inner cover 60 that is illustrated in FIG. 1, in that the protection portion 80A is integrally formed. For example, in the inner cover 60 that is illustrated in FIG. 1, the protection portion 80 that is a separate body is attached, and in contrast, in the inner cover 60A that is illustrated in FIG. 15, the protection portion 80A is integrally formed. Therefore, the protection portion 80A is different from the protection portion 80 described above, in that the protection portion 80A is formed to be integrally combined with the inner cover 60A.

Figure 16:
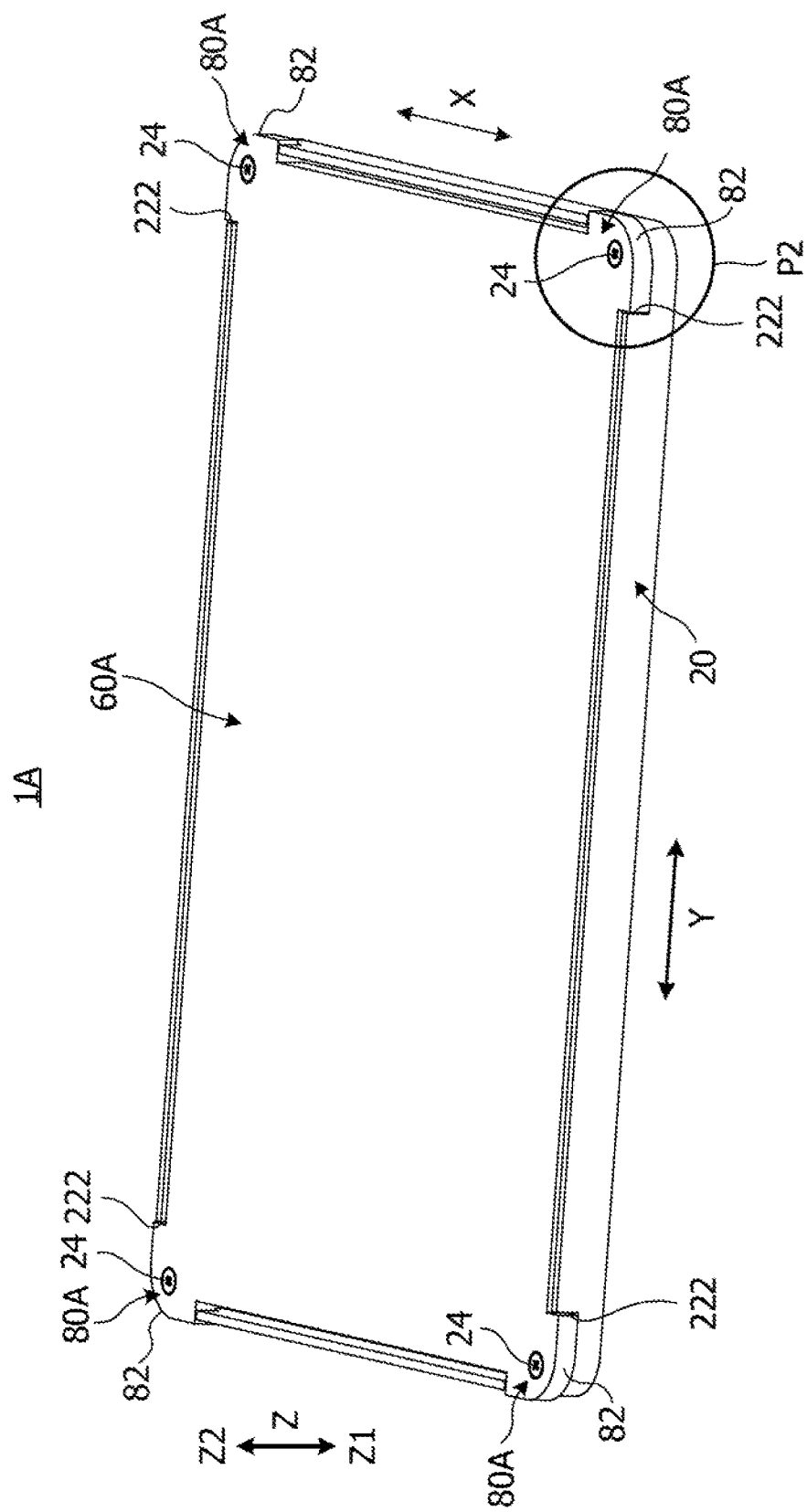
FIG. 16 is an exemplary exploded perspective view of a portion of the terminal device.

FIG. 16 illustrates an exemplary exploded perspective view of a portion of the terminal device. FIG. 16 is an exploded perspective view of an exemplary terminal device 1A when viewed from the rear side, and is a perspective view in a state where the back cover 50 is removed.

The protection portion 80A, as described above, is formed with one portion of the inner cover 60A as illustrated in FIG. 16. Like the protection portion 80 that is illustrated in FIG. 1, the protection portion 80A, has a function of protecting the terminal device 1A from a shock that can be applied to the terminal device 1A due to dropping of the terminal device 1A or the like. The inner cover 60A, as illustrated in FIG. 16, is fastened to the inner cover 60A with the screw 24 in a region of the protection portion 80A.

The protection portion 80A, as illustrated in FIG. 16, is provided on each of the four corner portions of the terminal device 1A in a state of protruding outward from a side surface of the terminal device 1A. For example, each of the four protection portions 80A is provided, corresponding to the notch 222 of the side surface frame 220, which is formed on each of the four corner portions of the terminal device 1A. As illustrated in FIG. 16, the protection portion 80A extends outward (to the outer side of the side direction) pass the side surface frame 220, from behind the side surface frame 220, through the notch 222 of the side surface frame 220 of the front cover 20. Therefore, the protection portion 80A, as illustrated in FIG. 16, extends (to the outer side of the side direction) more outward than the front cover 20, on each of the four corner portions of the terminal device 1A. For example, like the protection portion 80 that is illustrated in FIG. 1, the protection portion 80A has the protrusion part 82. Moreover, as described above, the protrusion part 82 extends in a region that does not overlap the front cover 20 when viewed from the side surface.

Figure 17:
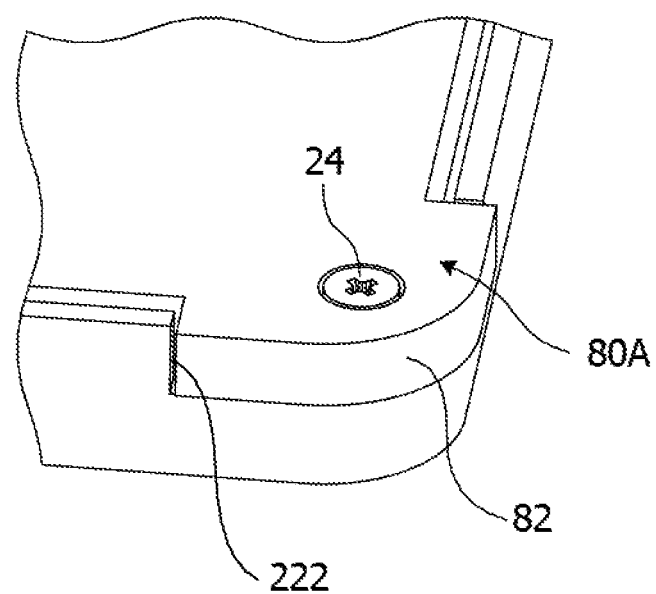
FIG. 17 is an exemplary view of an enlarged portion Q of FIG. 16.
Figure 18:
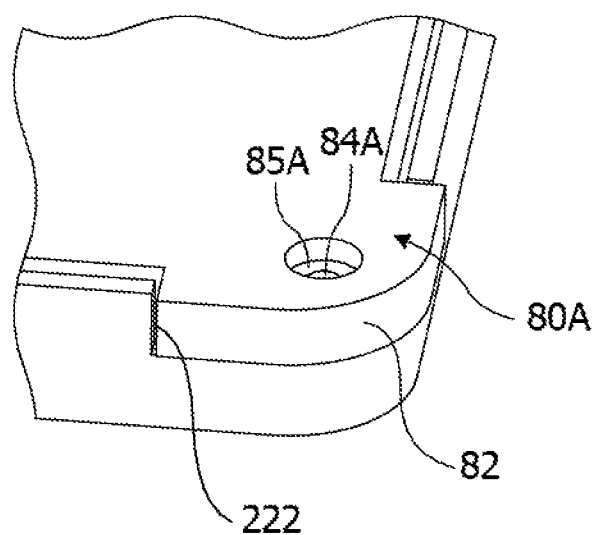
FIG. 18 is an exemplary state where a screw is removed from the portion of FIG. 17.
Figure 19:
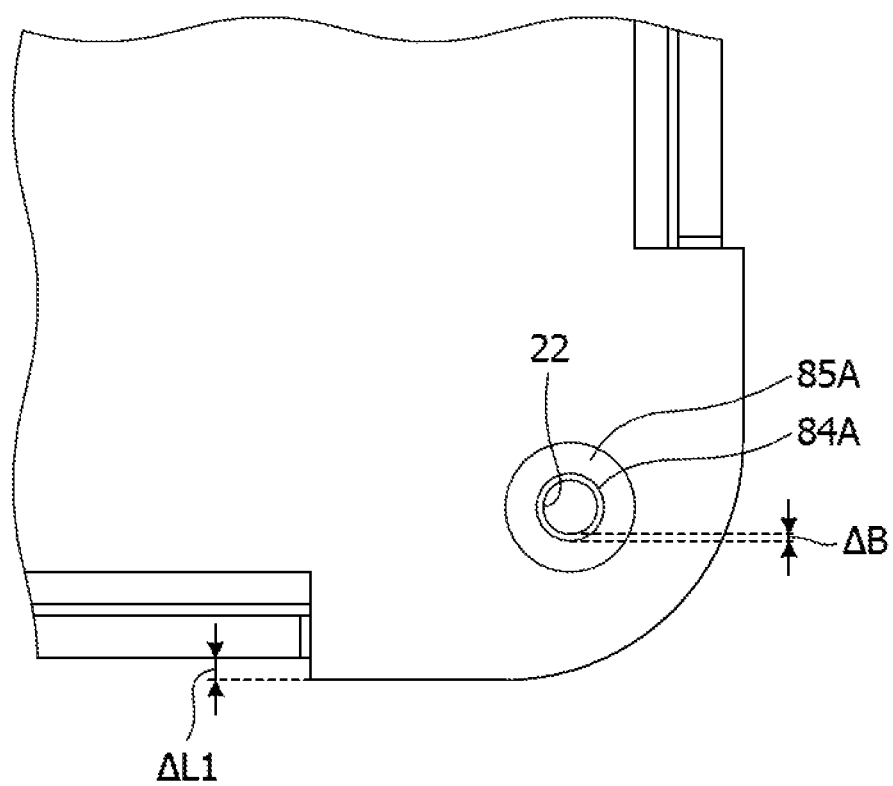
FIG. 19 is an exemplary upper surface of an enlarged portion Q of FIG. 16.

FIG. 17 illustrates an exemplary view of an enlarged portion Q of FIG. 16. FIG. 18 illustrates an exemplary state where the screw is removed from the portion of FIG. 17. FIG. 19 illustrates an exemplary upper surface of an enlarged portion Q of FIG. 16. For example, FIG. 17 to FIG. 19 illustrate a nominal state (a home position on the design).

The protection portion 80A, as illustrated in FIG. 18, includes the protrusion part 82, a base portion 83A, and a screw insertion hole 84A. The base portion 83A is formed with four corner portions of the inner cover 60A.

The screw insertion hole 84A is a hole through which the screw 24 passes. A bearing surface 85A that is brought into contact with a fastening surface of the screw 24 is formed around the screw insertion hole 84A. The screw insertion hole 84A is a hole that is somewhat larger than the axis portion of the screw 24, and for example, is spaced by a distance ΔB as illustrated in FIG. 19. As described above, in the nominal state, the protection portion 80A, as illustrated in FIG. 19, protrudes outward, by the extent of the protrusion that is the distance ΔL1, from the front cover 20, when viewed from above.

At this point, the distance ΔL1 and the distance ΔB in the shock direction Q have the following relationship.

distance ΔB<distance ΔL1    Relationship 3:

certain value Th<distance ΔB    Relationship 4:

Even in the state where the inner cover 60A is displaced by the distance ΔB in the shock direction Q inside of the front cover 20, by maintaining the relationship 3 described above, a state is obtained where the protrusion part 82 of the protection portion 80A protrudes outward from the front cover 20. When the strongest shock that is assumed as possible is applied among shocks that can be applied to the terminal device 1A, the certain value Th corresponds to an amount by which the inner cover 60A is displaced in the shock direction Q inside of the front cover 20. The certain value Th is an adaptation value, and for example, is decided by experiment or the like. Even in a state where the inner cover 60A is displaced by the distance ΔB in the shock direction Q inside of the front cover 20, by maintaining the relationship 4 described above, a state is obtained where the inner cover 60A (the screw insertion hole 84A) is spaced in the shock direction Q away from the axis portion of the screw 24.

Also in the terminal device 1A that is illustrated in FIG. 15, by including the protection portion 80A, the LCD camera 12 or the touch panel 11 that is a component which has comparatively low shock resistance may be protected from a shock. For example, in the corner portion of the terminal device 1A, as described above, because the protrusion part 82 of the protection portion 80A protrudes outward from the front cover 20, the shock is initially applied to the protrusion part 82 of the protection portion 80A, not to the front cover 20. Because the distance ΔL1 is set to be greater than the distance ΔB (>the certain value Th), although the inner cover 60A is displaced to the maximum in the shock direction Q inside of the front cover 20, the protrusion part 82 of the protection portion 80A remains in the state of protruding outward from the front cover 20. For this reason, even in a case where a shock that is so strong that the inner cover 60A is displaced comparatively much in the shock direction Q inside of the front cover 20 is applied, a part that directly receives the shock is limited only to the protrusion part 82. Even in the case where a shock that is so strong that the inner cover 60A is displaced comparatively much in the shock direction Q inside of the front cover 20 is applied, by setting the distance ΔB to be greater than the certain value Th, the propagation of the shock to the front cover 20 through the axis portion of the screw 24 may be reduced.

For example, in the terminal device 1 that is illustrated in FIG. 1 or the terminal device 1A that is illustrated in FIG. 15, an outer end surface (a side surface) of the protrusion part 82 of the protection portion 80 or 80A may be coated with rubber in order to stop sliding.

For example, the terminal device 1 that is illustrated in FIG. 1 or the terminal device 1A that is illustrated in FIG. 15, the protection portion 80 or 80A is provided on all of the four corner portions of the terminal device 1 or 1A, but may be provided on one or several of the four corner portions of the terminal device 1 or 1A, or may be provided on a side-portion region other than the corner portion.

The protection portion 80 that is illustrated in FIG. 1 is provided on the rear side of the inner cover 60, but may be provided on a front side of the inner cover 60.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A terminal device comprising:
   a first support member that supports a first component;
   a second support member that is separately provided from the first support member and that holds a second component; and
   a protection portion that is provided on the first support member and that extends more outward in a first direction than the second support member, wherein a part of the protection portion, which extends more outward than the second support member, extends in a region that does not overlap the second support member when viewed from the first direction,
   wherein the protection portion faces the first support member in the first direction with a gap of a first distance,
   wherein the second support member includes a female screw portion that is engaged with a screw, and
   wherein the protection portion has a through hole through which the screw passes, and a gap is formed such that the gap between an axis portion of the screw and an edge of the through hole in the first direction has a third distance that is greater than the first distance.

2. The terminal device according to claim 1, wherein the second support member is a front cover of a casing that forms an inner space, and wherein the first support member is provided within the inner space.

3. The terminal device according to claim 1, wherein the second support member includes a side surface frame having a notch, and wherein the protection portion extends outward in the first direction from behind the side surface frame through the notch.

4. The terminal device according to claim 3, wherein the side surface frame has the notch at a position that corresponds to a corner portion of the terminal device.

5. The terminal device according to claim 1, wherein the protection portion is integrally formed with the first support member.

6. The terminal device according to claim 1, wherein each of the protection portion and the first support member has a curved surface that faces each other in the first direction with the gap of the first distance.

7. The terminal device according to claim 6, wherein the protection portion extends more outward by a second distance in the first direction than the second support member, the second distance being greater than the first distance.

8. The terminal device according to claim 1, wherein the first direction is parallel with a display surface of the terminal device.

9. The terminal device according to claim 1, wherein the first direction is a direction vertical to a side surface of a corner portion of the terminal device.

10. The terminal device according to claim 1, wherein the protection portion is made from resin material.

11. The terminal device according to claim 1, wherein the first component includes a substrate and a battery.

12. The terminal device according to claim 1, wherein the second component is at least any one of a display device and a touch panel.

* * * * *